(12) United States Patent
Watase et al.

(10) Patent No.: US 7,595,557 B2
(45) Date of Patent: Sep. 29, 2009

(54) SEMICONDUCTOR DEVICE AND MANUFACTURING METHOD THEREOF

(75) Inventors: Kazumi Watase, Kyoto (JP); Akio Nakamura, Shiga (JP); Katsumi Ootani, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/453,827

(22) Filed: Jun. 16, 2006

(65) Prior Publication Data

US 2006/0286689 A1 Dec. 21, 2006

(30) Foreign Application Priority Data

Jun. 17, 2005 (JP) ............................. 2005-177067
Apr. 4, 2006 (JP) ............................. 2006-102611

(51) Int. Cl.
*H01L 29/40* (2006.01)

(52) U.S. Cl. ..................... 257/773; 257/774; 438/17; 438/18

(58) Field of Classification Search ................ 257/773, 257/774, 775, 778, 779, 780, 781, 785, 786; 438/17, 18, 106, 599, 611–614, 618, 622
See application file for complete search history.

(56) References Cited

U.S. PATENT DOCUMENTS 5,334,857 A * 8/1994 Mennitt et al. ................ 257/48
6,037,794 A    3/2000 Yamamoto et al.
6,426,904 B2 * 7/2002 Barth et al. ................. 365/201
6,445,001 B2 * 9/2002 Yoshida ........................ 257/48
6,614,049 B1 * 9/2003 Koyama ........................ 257/48
6,764,879 B2 * 7/2004 Nagao et al. ................. 438/110
7,148,504 B2 * 12/2006 Yamada ........................ 257/48
2004/0101985 A1 * 5/2004 Whetsel et al. ............... 438/17

FOREIGN PATENT DOCUMENTS

| JP | 61-048927 | 3/1986 |
| JP | 03-278552 | 12/1991 |
| JP | 05144901 A | 6/1993 |
| JP | 06-120307 | 4/1994 |
| JP | 2002-039801 | 2/2002 |
| JP | 2002-296314 | 10/2002 |
| JP | 2003-163279 | 6/2003 |
| JP | 2004-253445 | 9/2004 |
| JP | 2004-296464 | 10/2004 |

* cited by examiner

*Primary Examiner*—Zandra Smith
*Assistant Examiner*—Paul E Patton
(74) *Attorney, Agent, or Firm*—Steptoe & Johnson LLP

(57) ABSTRACT

A metal wire for inspection and an electrode for inspection are formed on a region of a semiconductor substrate where a metal wire and an electrode for external connection are not formed. The metal wire for inspection and the electrode for inspection electrically detect an open failure, a short-circuit failure and a leakage failure of the metal wire and a connection failure between an element electrode and the metal wire. A semiconductor wafer is subjected to an electrical test, so that it is possible to detect the aforementioned failures with good accuracy during a manufacturing process.

16 Claims, 4 Drawing Sheets

SEMICONDUCTOR DEVICE AND MANUFACTURING METHOD THEREOF

BACKGROUND OF THE INVENTION

1. Field of the Invention

The present invention relates to a semiconductor device including a semiconductor substrate having metal wires and electrodes each formed thereon, and a manufacturing method of the semiconductor device.

2. Description of the Related Art

Along with development of highly integrated, fine semiconductor elements, recently, element electrodes increase in number and a semiconductor integrated circuit including plural semiconductor elements reduces in size at a rapid pace. As a result, an element electrode to be formed on a semiconductor integrated circuit on a semiconductor substrate requires a finer pitch and a reduction in area. In order to respond to the demands, however, it is indispensable that a probe directly coming into contact with an element electrode in an electrical characteristic test is improved and a technique for fine patterning such as wire bonding is developed. Consequently, it is difficult to respond to the aforementioned demands rapidly under current circumstances. As one of solutions, there is developed a rewiring technique that electrodes for external connection are provided on a semiconductor substrate in a lattice shape and element electrodes arranged on a periphery are connected to each other through a metal wire. According to the rewiring technique, it is possible to respond to the demands of a finer pitch and a reduction in area in regard to element electrodes arranged on a periphery and to increase element electrodes in number. Examples of a typical semiconductor package using the rewiring technique include a FC-BGA (Flip Chip Ball Grid Array) that a bump electrode is formed on an electrode for external connection and is connected to an interface substrate by a flip chip connection, and a wafer level CSP (Chip Size Package) that an external terminal is directly formed on an electrode for external connection.

Herein, description will be given of terminal interconnection in a conventional wafer level CSP with reference to FIGS. 4A to 4C. FIG. 4A is a perspective view illustrating an entire semiconductor wafer. FIG. 4B is a conceptual plan view illustrating a structure of a conventional wafer level CSP. FIG. 4C is a sectional view illustrating terminal interconnection in the conventional wafer level CSP, taken along a line A-A' in FIG. 4B.

As illustrated in FIG. 4A, chips are formed over a semiconductor wafer 106. For each chip, herein, a wafer level CSP 107 is formed as a semiconductor integrated circuit.

As illustrated in FIG. 4B, the wafer level CSP 107 includes a semiconductor substrate 101, an insulating layer 103, plural electrodes 105 for external connection, and a metal wire 104. The insulating layer 103 is provided on a side, where a semiconductor integrated circuit is formed, of the semiconductor substrate 101. Each electrode 105 for external connection transmits/receives a signal to/from an external device. The metal wire 104 connects between the electrode 105 for external connection and an element electrode 102. A material for the metal wire 104 is equal to that for the electrode 105 for external connection, and specific examples thereof include Al and Cu. Herein, processing until formation of the metal wire 104 is collectively called a rewiring technique.

As illustrated in FIG. 4C, the element electrode 102, a passivation film 108 and the insulating film 103 are formed on the semiconductor substrate 101. The element electrode 102 is connected to the semiconductor integrated circuit, and the passivation film 108 and the insulating layer 103 are partly opened at the element electrode 102.

Hereinafter, description will be given of a manufacturing method of the wafer level CSP 107 with reference to FIGS. 4A to 4C.

First, an element electrode 102 and a passivation film 108 are formed on a semiconductor substrate 101. Then, an insulating layer 103 is deposited over a surface of the semiconductor substrate 101 by a spin coating method. Thereafter, an opening 103a is formed in the insulating layer 103 by a well-known lithography technique so that the element electrode 102 is exposed therefrom. Next, a Cu film is deposited on the insulating layer 103 by a sputtering method or the like. Then, the Cu film is selectively etched. Thus, a Cu metal wire 104 for connecting between an electrode 105 for external connection, transmitting/receiving a signal to/from an external device, and the element electrode 102 is formed on the insulating layer 103.

Conventionally, a TEG (Test Element Group) wafer for process evaluation, different from a product wafer, is used for evaluating and analyzing a degree of reliability in a metal wire 104, determining process conditions of a rewiring technique, and introducing the determined process conditions into an actual manufacturing process of a product wafer. Herein, a metal wire 104 is subjected to evaluation by an electrical test in regard to reliability in wiring such as an open failure, a short-circuit failure and a leakage failure and reliability in connectivity with an element electrode 102. In a wafer level CSP 107, further, a product wafer having a design rule equal to that of a TEG wafer for process evaluation, such as a width and an interval (hereinafter, referred to as "Line/Space") of a metal wire 104, a pitch between electrodes 105 for external connection, and a dimension of an opening 103a on an element electrode 102, adopts process conditions equal to those in the TEG wafer for process evaluation, and is not subjected to evaluation by an electrical test in regard to reliability in wiring of the metal wire 104 such as an open failure, a short-circuit failure and a leakage failure and reliability in connectivity between the metal wire 104 and the element electrode 102 in general. Actually, a wiring state of a metal wire 104 in a product wafer is visually checked or is checked by an automatic appearance test during a manufacturing process. Further, after completion, a wafer level CSP is subjected to a final electrical characteristic test in order to inspect an open failure, a short-circuit failure and an leakage failure that cannot be checked by an appearance test, and connectivity between an element electrode 102 and a metal wire 104. Upon detection of a failure, a product having the failure is subjected to polishing or failure analysis using a FIB (Focused Ion Beam) or a SEM (Scanning Electron Microscope) in order to identify whether a defective site is a semiconductor integrated circuit or a metal wire.

As described above, a product wafer having a design rule equal to that of a TEG wafer for process evaluation, such as Line/Space of a metal wire, a pitch between electrodes for external connection, and a dimension of an opening on an element electrode adopts process conditions determined for the TEG wafer for process evaluation and, therefore, is not actually subjected to evaluation by an electrical test for a metal wire performed for the TEG wafer for process evaluation. However, a TEG wafer for process evaluation is different from a product wafer in internal wiring design and pattern dimension of a semiconductor substrate. Therefore, the TEG wafer for process evaluation is largely different from the product wafer in surface irregularities of a semiconductor substrate. In some cases, such surface irregularities of the semiconductor substrate affect reliability of a metal wire to be formed on the semiconductor substrate. Further, a surface state of an element electrode, more specifically, a state of a surface coat of an element electrode differs for each product wafer; therefore, reliability in connectivity between an element electrode and a metal wire also differs for each product wafer. In some cases, reliability of a metal wire cannot be secured with certainty. In addition, a conventional appearance test method has limitations in regard to detection precision. Therefore, as a metal wire is formed finely, it is difficult to accurately detect a shape failure of a metal wire, resulting in an outflow of defective products with a high possibility. Such a defective product must be detected in a final electrical characteristic test. Further, even when a defective product is detected in a final electrical characteristic test, such a defective product must be subjected to polishing or processing using a FIB in order to identify whether a defective site is a semiconductor integrated circuit or a metal wire and, further, is subjected to failure analysis by observation using a SEM or the like. Therefore, it takes much time to obtain a result of the analysis, and it is difficult to feed back the result to subsequent lots in a timely manner. Moreover, a product wafer is subjected to a test in a complete state; therefore, it is impossible to replace a defective wafer or chip with new one.

SUMMARY OF THE INVENTION

The present invention is made to solve the aforementioned problems, and it is therefore an object of the present invention to provide a semiconductor device and a manufacturing method thereof, each capable of performing an electrical test on a metal wire in a semiconductor wafer during a manufacturing process to detect a failure of a metal wire with good accuracy and, also, promptly and correctly identifying a cause of the failure in the metal wire to feed back the result to the manufacturing step.

In order to achieve this object, the present invention provides a semiconductor device comprising a semiconductor substrate having a semiconductor integrated circuit formed thereon, an element electrode electrically connected to the semiconductor integrated circuit, a plurality of electrodes for external connection each formed on the semiconductor substrate to transmit/receive a signal to/from an external device, a metal wire electrically connecting between the element electrode and the electrode for external connection, another metal wire for inspection that is not brought into contact with the metal wire, and electrodes for inspection formed on both ends of the metal wire for inspection. Herein, the electrode for inspection is electrically measured so that the metal wire for inspection is subjected to an electrical test.

The semiconductor device further comprises an opening formed on at least the element electrode, and an insulating layer formed on the semiconductor substrate.

Further, the electrodes for external connection is used for at least one of the electrodes for inspection.

Further, the electrode for external connection used as the electrode for inspection is electrically connected to the metal wire.

Further, the metal wire for inspection is formed for each semiconductor integrated circuit formed on one semiconductor substrate serving as a semiconductor wafer.

Still further, the metal wire for inspection is formed on surface irregularities of the semiconductor substrate corresponding to a lower layer wiring pattern.

Still further, the metal wire for inspection has a width equal to a minimum width of the metal wire.

Still further, the metal wire for inspection has a length longer than a maximum length of the metal wire.

The semiconductor device further comprises at least two openings formed on the element electrode. Herein, the metal wire for inspection and the electrode for inspection are electrically connected to the element electrode through the at least two openings.

Further, at least two of the semiconductor integrated circuits are formed on the semiconductor wafer, and the metal wire for inspection is formed across the semiconductor integrated circuits adjacent to each other.

The present invention also provides a manufacturing method of a semiconductor device, comprising a first step of forming an element electrode electrically connected to a semiconductor integrated circuit on a semiconductor substrate having the semiconductor integrated circuit formed thereon, and a second step of simultaneously forming an electrode for external connection for transmitting/receiving a signal to/from an outside of the semiconductor integrated circuit, a metal wire connecting between the element electrode and the electrode for external connection, and another metal wire for inspection that is not brought into contact with the metal wire.

The present invention also provides a manufacturing method of a semiconductor device, comprising a first step of forming an element electrode electrically connected to a semiconductor integrated circuit on a semiconductor substrate having the semiconductor integrated circuit formed thereon, a second step of forming an insulating layer having an opening for exposing the element electrode therethrough, on the semiconductor substrate including the element electrode formed over the semiconductor substrate, and a third step of simultaneously forming an electrode for external connection for transmitting/receiving a signal to/from an outside of the insulating layer, a metal wire connecting between the element electrode and the electrode for external connection, and a metal wire for inspection that is not brought into contact with the metal wire.

Further, in the second step, the opening is partly divided into at least two openings on the element electrode, and in the third step, the metal wire for inspection and the electrode for inspection are electrically connected to the element electrode through the at least two openings.

DESCRIPTION OF THE PREFERRED EMBODIMENTS

Hereinafter, description will be given of preferred embodiments of the present invention with reference to the drawings.

First, description will be given of a structure of a semiconductor device according to the present invention with reference to FIGS. 1A, 1B, 1C, 2A and 2B.

Figure 1A:
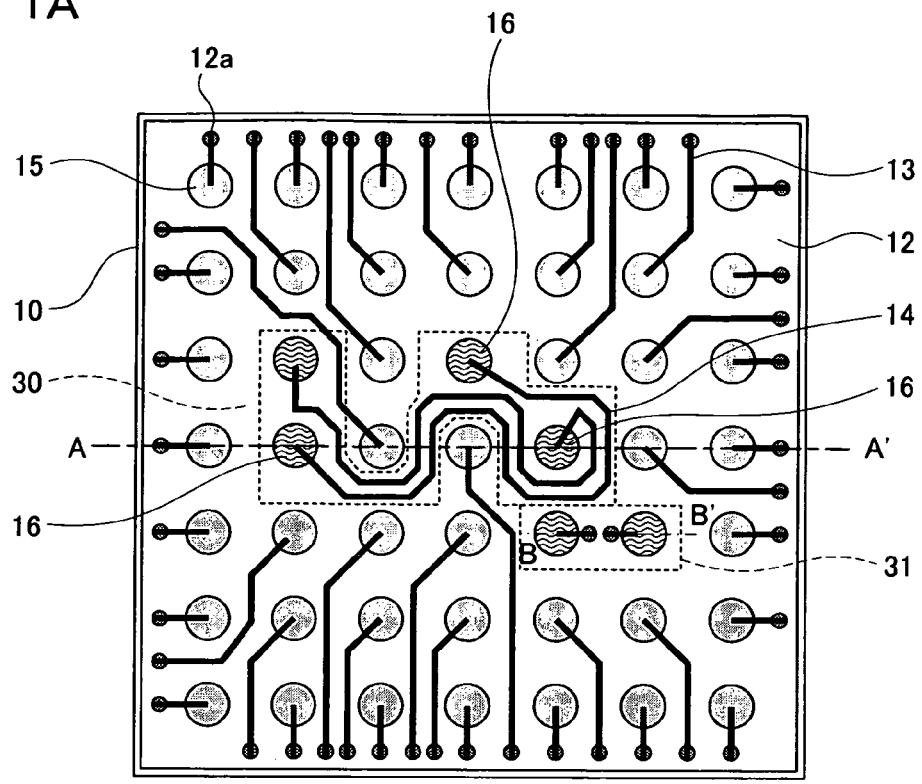
FIG. 1A is a conceptual plan view illustrating a structure of a semiconductor device according to the present invention.
Figure 1B:
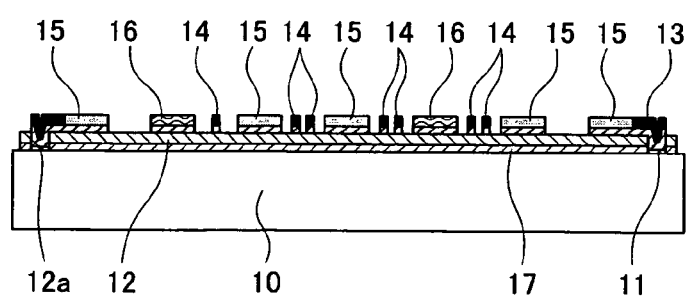
FIG. 1B is a sectional view illustrating a wiring reliability inspection region in the semiconductor device according to the present invention.
Figure 1C:
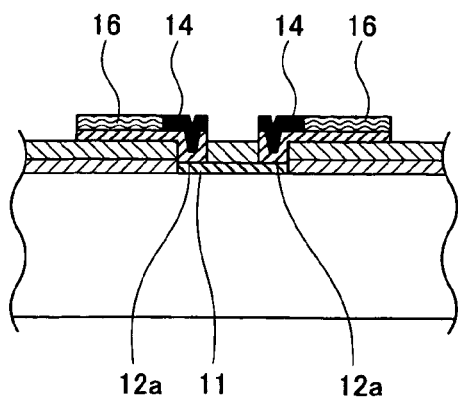
FIG. 1C is a sectional view illustrating a connectivity inspection region in the semiconductor device according to the present invention.
Figure 2A:
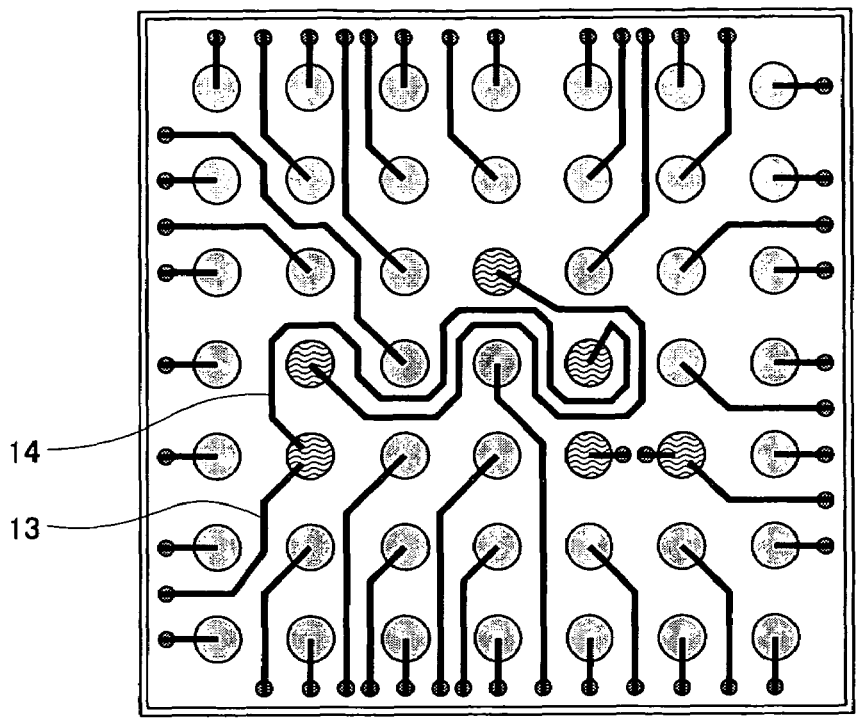
FIG. 2A is a conceptual plan view illustrating a structure of the semiconductor device according to the present invention wherein electrodes are used for both purposes of external connection and inspection.
Figure 2B:
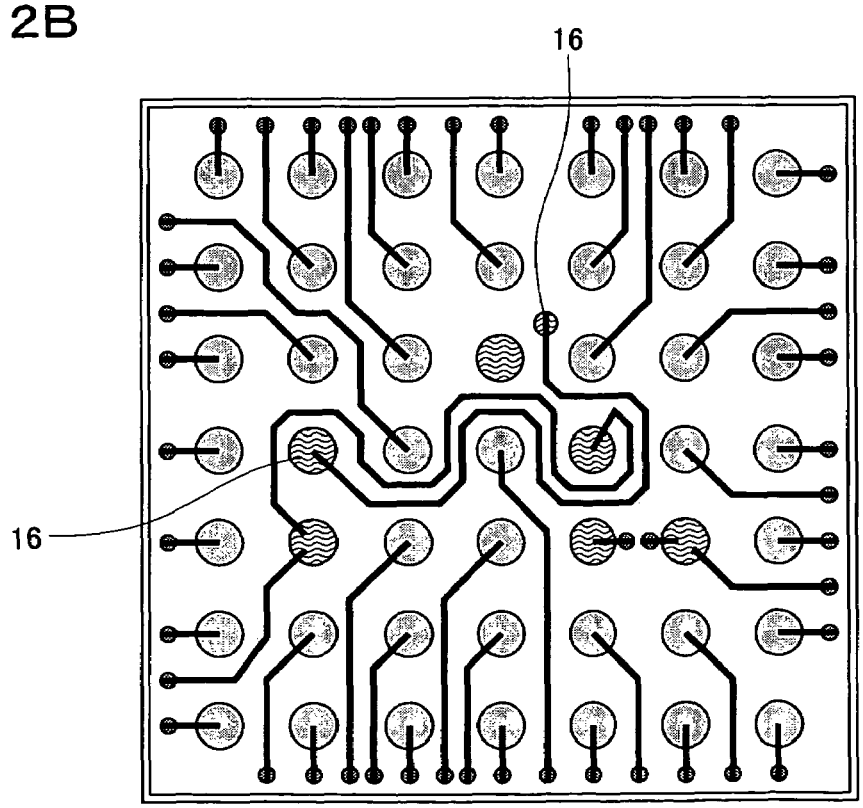
FIG. 2B is a conceptual plan view illustrating a structure of the semiconductor device according to the present invention wherein electrodes for inspection to be used herein are different from each other in dimension.

FIG. 1A is a conceptual plan view illustrating a structure of the semiconductor device according to the present invention. FIG. 1B is a sectional view of a wiring reliability inspection region in the semiconductor device according to the present invention, taken along a line A-A' in FIG. 1A. FIG. 1C is a sectional view illustrating a connectivity inspection region in the semiconductor device according to the present invention, taken along a line B-B' in FIG. 1A. FIG. 2A is a conceptual plan view illustrating a structure of the semiconductor device according to the present invention where electrodes are used for both purposes of external connection and inspection. FIG. 2B is a conceptual plan view illustrating a structure of the semiconductor device according to the present invention where electrodes for inspection to be used herein are different from each other in dimension.

As illustrated in FIG. 1A, a semiconductor integrated circuit configured by semiconductor elements such as a transistor is formed on a semiconductor substrate 10. An insulating layer 12 is formed on a semiconductor integrated circuit formation face of the semiconductor substrate 10. As products, a metal wire 13 and an electrode 15 for external connection are formed on the insulating layer 12. A metal wire 14 for inspection is formed on a region of the insulating layer 12 except a region where the metal wire 13 and the electrode 15 for external connection are formed. An electrode 16 for inspection is formed to have an optional dimension. Regions surrounded by dotted lines are a wiring reliability inspection region 30 and a connectivity inspection region 31. Herein, the metal wire 13, the electrode 15 for external connection, the metal wire 14 for inspection and the electrode 16 for inspection are made of a single material.

The metal wire 14 for inspection interconnects between two electrodes 16 for inspection. The metal wire 14 for inspection in the wiring reliability inspection region 30 is routed by a predetermined distance or more in order to inspect wiring reliability. Further, a width of the metal wire 14 for inspection is made equal to a minimum width of the metal wire 13 and a length of the metal wire 14 for inspection is made longer than a maximum length of the metal wire 13, so that a failure is detected with high sensitivity. The metal wire 14 for inspection may be formed on a region having considerable surface irregularities in order to inspect wiring reliability of an internal wire. During a process of manufacturing a semiconductor device, a test for continuity is performed on the metal wire 14 for inspection between the electrodes 16 for inspection to detect a failure.

As described above, a test for wiring is performed during a manufacturing process of a semiconductor device by provision of the metal wire 14 for inspection and the electrode 16 for inspection, so that failures about a shape of a metal wire, such as an open failure, a short-circuit failure and a leakage failure that have not been detected by a conventional appearance test and a failure about connectivity between an element electrode and a metal wire that has been inspected only by a final electrical characteristic test after completion of a semiconductor device can be detected by an electrical test for each product in a semiconductor wafer state with good accuracy during a manufacturing process. In addition, such an electrical test is performed on all wafers, so that a cause of a failure can be promptly and correctly identified without polishing or FIB processing for a product, and such a cause can be fed back to a manufacturing process in a timely manner. Further, a metal wire for inspection is provided for each product, so that such a metal wire for inspection can be used as a metal wire susceptible to influence of surface irregularities of a semiconductor substrate, and can be used for process control for each product.

As illustrated in FIG. 2A, the metal wire 14 for inspection may be electrically connected to not only the electrode 16 for inspection but also the electrode 15 for external connection connected to the metal wire 13 so that these electrodes are used for both purposes of external connection and inspection. As illustrated in FIG. 2B, the electrode 16 for inspection may be formed to have a dimension and a pitch each equal to those of the electrode 15 for external connection. Alternatively, the electrode 16 for inspection may be formed to have a minimum dimension in such a degree that a probe for inspection comes into contact therewith.

Next, description will be given of a cross section of the wiring reliability inspection region 30 with reference to FIG. 1B. The element electrode 11 to be connected to the semiconductor integrated circuit is formed on the semiconductor substrate 10. The passivation film 17 and the insulating layer 12 each opened at the element electrode 11 are formed in this order so as to almost entirely cover the semiconductor substrate 10. Herein, the passivation film 17 is made of a silicon nitride or a silicon oxide. In an opening 12a, the metal wire 13 and the electrode 15 for external connection are formed across the element electrode 11 exposed from the opening 12a and a part of the insulating layer 12. The metal wire 14 for inspection and the electrode 16 for inspection are formed on the insulating layer 12 except a region where the metal wire 13 and the electrode 15 for external connection are formed. Herein, description is given of a case that the insulating layer 12 is formed; however, the insulating layer 12 is not necessarily to form.

Next, description will be given of a cross section of the connectivity inspection region 31 with reference to FIG. 1C. At least two openings 12a are formed in the insulating layer 12 on the element electrode 11. At least two metal wires 14 for inspection and at least two electrodes 16 for inspection each formed on the insulating layer 12 are electrically connected to each other through the at least two openings 12a and the element electrode 11. In general, even when a failure about connectivity between the metal wire 13 and the element electrode 11 occurs, such a failure can be electrically checked only through an internal circuit such as a transistor. According to the present invention, the metal wires 14 for inspection are electrically connected to each other through the element electrode 11; therefore, it is possible to check the connectivity and to inspect a wiring failure with good accuracy. Further, depending on a method for forming the metal wire 14 for inspection, it is possible to measure a contact resistance value between the metal wire 14 for inspection and the element electrode 11 by a 4-terminal method.

Next, description will be given of a manufacturing method of the semiconductor device according to the present invention with reference to FIGS. 3A to 3D.

Figure 3A:
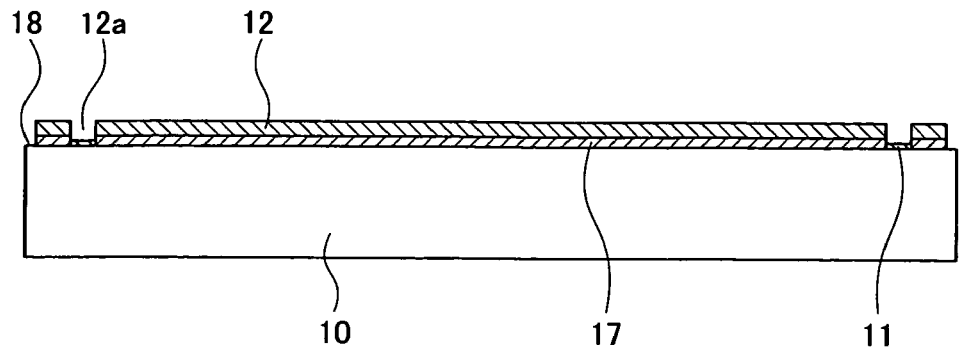
FIG. 3A is a sectional view illustrating a step of forming an opening in the semiconductor device according to the present invention.
Figure 3B:
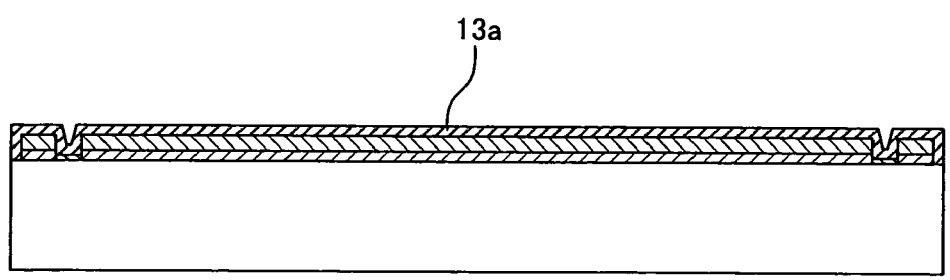
FIG. 3B is a sectional view illustrating a step of forming a thin metal layer in the semiconductor device according to the present invention.
Figure 3C:
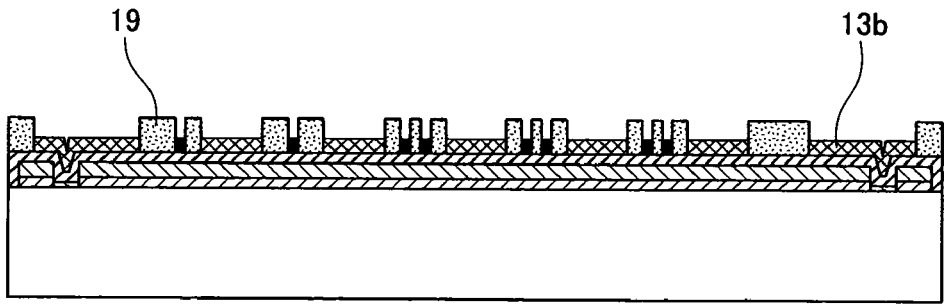
FIG. 3C is a sectional view illustrating a step of forming a thick metal layer in the semiconductor device according to the present invention.
Figure 3D:
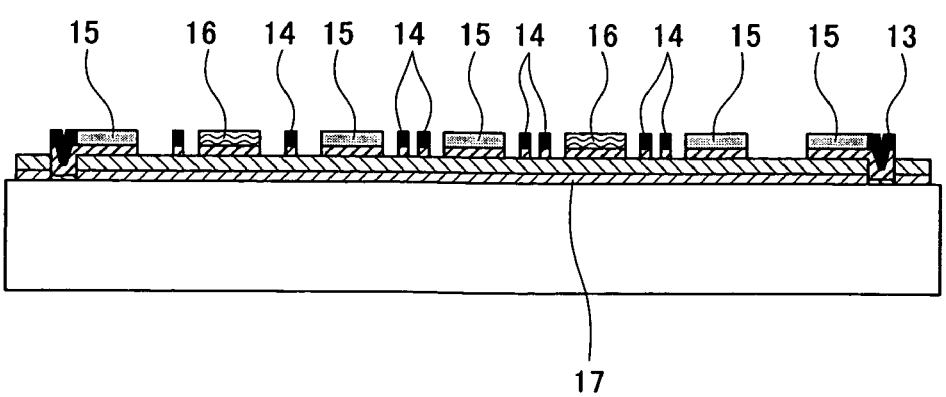
FIG. 3D is a sectional view illustrating a step of removing a plating resist in the semiconductor device according to the present invention.
Figure 4A:
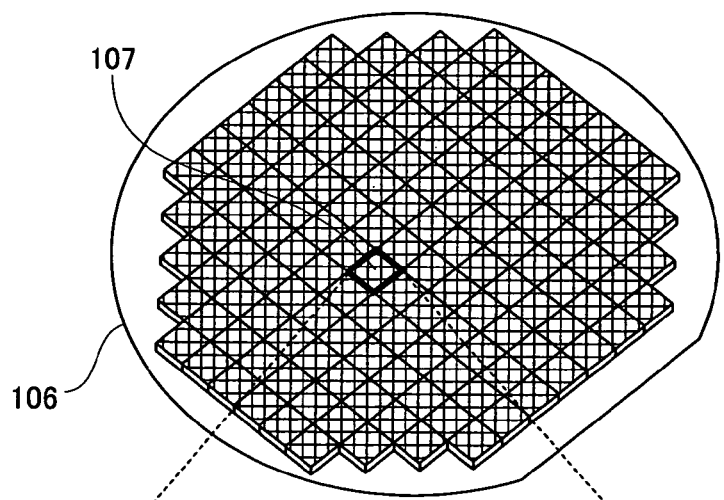
FIG. 4A is a perspective view illustrating an entire semiconductor wafer.
Figure 4B:
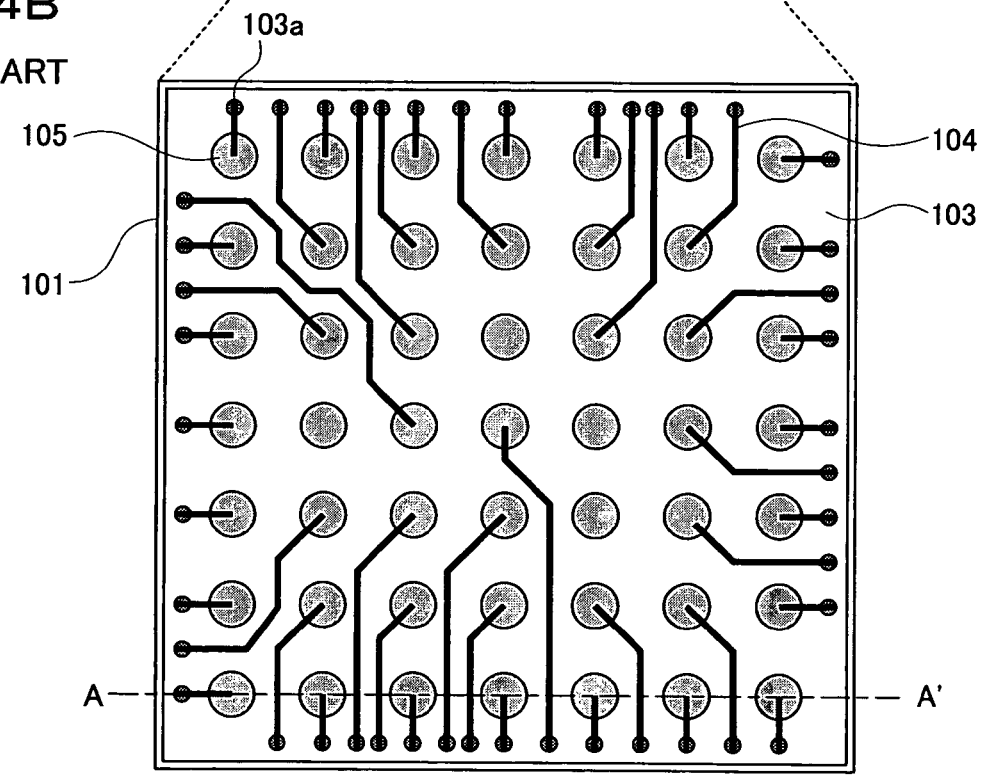
FIG. 4B is a conceptual plan view illustrating a structure of a conventional wafer level CSP.
Figure 4C:
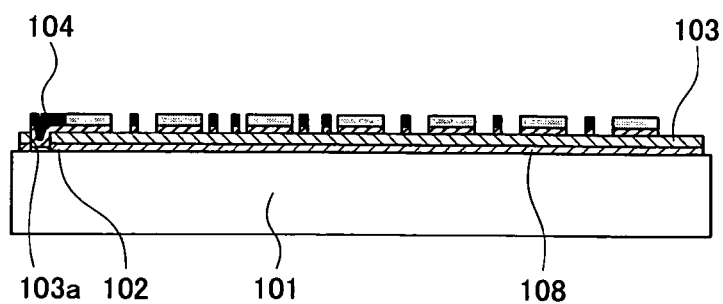
FIG. 4C is a sectional view illustrating terminal interconnection in the conventional wafer level CSP.

FIG. 3A is a sectional view illustrating a step of forming an opening in the semiconductor device according to the present invention. FIG. 3B is a sectional view illustrating a step of forming a thin metal layer in the semiconductor device according to the present invention. FIG. 3C is a sectional view illustrating a step of forming a thick metal layer in the semiconductor device according to the present invention. FIG. 3D is a sectional view illustrating a step of removing a plating resist in the semiconductor device according to the present invention.

First, a semiconductor substrate 10 in a wafer state is prepared. The semiconductor substrate 10 has a semiconductor integrated circuit including semiconductor elements such as a transistor and a capacitor. An element electrode 11 is also formed on the surface of the semiconductor substrate 10.

As illustrated in FIG. 3A, similarly to a conventional manner, a passivation film 17 is deposited over the semiconductor substrate 10. Further, the passivation film 17 is coated with an insulating material serving as an insulating layer 12 having photosensitivity by a spin coating method. The insulating material is dried and, then, is subjected to exposure and development sequentially. Thereafter, the passivation film 17 and the insulating layer 12 on the element electrode 11 are selectively removed to form an opening 12a. Herein, a material for the insulating layer 12 having photosensitivity is not particularly limited as long as it has photosensitivity, and examples thereof include polymers such as an ester-bonded polyimide polymer and an acrylate epoxy polymer. Alternatively, the insulating layer 12 having photosensitivity may be made of a material previously formed into a film. In this case, the insulating layer 12 is laminated on the semiconductor substrate 10, an opening 12a is formed in the insulating layer 12 by exposure and development, and the element electrode 11 is exposed from the opening 12a. Herein, it is unnecessary to form the insulating layer 12 on a scribe line 18 and an outer edge of an element region adjacent to the scribe line 18.

Next, as illustrated in FIG. 3B, a thin metal layer 13a having a Ti film with a thickness of, for example, about 0.2 μm and a Cu film with a thickness of, for example, 0.5 μm provided in this order is formed over the insulating layer 12 and the element electrode 11 exposed from the opening 12a by a thin-film formation technique such as a vacuum evaporation method, a sputtering method or a CVD method.

Next, as illustrated in FIG. 3C, the semiconductor substrate 10 is entirely coated with a positive-type photosensitive resist film or a negative-type photosensitive resist film by a spin coating method. The resist film is dried and, then, a pattern of a plating resist 19 is formed from the resist film by a well-known exposure and development technique. Then, a thick metal layer 13b is selectively formed on the thin metal layer 13a exposed from the plating resist 19 by a thick-film formation technique such as electroplating. The thick metal layer 13b selectively formed herein has a Cu film with a thickness of, for example, about 5 μm. A metal wire 13 and an electrode 15 for external connection are formed by the thick metal layer 13b. Simultaneously, a metal wire 14 for inspection and an electrode 16 for inspection are also formed. According to such a photolithographic process for forming a pattern through exposure and development, it is possible to change a pattern and to increase the number of patterns without increasing the number of masks and the number of steps for the plating resist 19.

Further, as illustrated in FIG. 3D, the plating resist 19 is melted for removal, and an etchant capable of melting the thin metal layer 13a for removal is applied there to. For example, a cupric chloride solution is used for etching of a thin Cu film and a hydrogen peroxide solution is used for etching of a TiW film. Thus, the thin metal layer 13a with a thin thickness is removed, and the metal wire 13, the electrode 15 for external connection, the metal wire 14 for inspection and the electrode 16 for inspection each formed by the thick metal layer 13b are left. In this process, the metal wire 13, the electrode 15 for external connection, the metal wire 14 for inspection and the electrode 16 for inspection are formed on respective predetermined portions of the semiconductor substrate 10. For example, if the metal wire 13 formed by electroplating has a thickness of 5 μm, the Line/Space thereof is 10/10 μm. In the description with reference to FIGS. 1A, 1B, 1C, 2A and 2B, an element electrode and a metal wire are directly connected to each other because a thick metal layer is not illustrated. In actual, an element electrode and a metal wire are connected to each other through a thick metal layer. A metal wire 14 for inspection may be formed on each of semiconductor integrated circuits formed on a semiconductor wafer, or may be formed on an optionally selected semiconductor integrated circuit. If a metal wire 14 for inspection is formed on each of adjacent semiconductor integrated circuits, electrodes 16 for inspection formed on the adjacent semiconductor integrated circuits are electrically connected to each other through the metal wire 14 for inspection formed across the semiconductor integrated circuits; thus, inspection efficiency can be enhanced. In a conventional manufacturing process, thereafter, a solder resist and an external terminal are formed over a surface of a wafer, and the wafer is divided into plural pieces by dicing and, then, each piece is subjected to a final test. Therefore, a metal wire 13 cannot be electrically inspected before the final test. According to the present invention, formation of a metal wire 14 for inspection makes it possible to electrically inspect a wafer at a point in time that the metal wire 14 for inspection is formed. As a technique for inspection, for example, a probe for use in a test after dispersion is dropped onto a metal wire 14 for inspection; thus, an electrical test can be performed. Further, depending on specifications of a probe, plural semiconductor substrates can be inspected simultaneously, leading to reduction in inspection time. Moreover, a failure of a metal wire 13 can be identified early; therefore, it is possible to make use of the failure to subsequent lots to thereby suppress influence of the failure at minimum.

What is claimed is:

1. A semiconductor device comprising:
    a semiconductor substrate having a semiconductor integrated circuit thereon;
    an element electrode on the semiconductor substrate and electrically connected to the semiconductor integrated circuit;
    at least one test electrode on the semiconductor substrate;
    a plurality of first external electrodes on the semiconductor substrate and connected to the element electrode by a first metal wire;
    a plurality of second external electrodes on the semiconductor substrate connected to the element electrode with the first metal wire and connected to the test electrode by a second metal wire, and
    wherein the second metal wire is for detecting through an electrical test shape defects of a metal wire in the device.

2. The semiconductor device according to claim 1, further comprising an insulating layer on the semiconductor substrate, wherein the insulating layer has an opening on the element electrode.

3. The semiconductor device according to claim 1, wherein the second metal wire is on a portion of the semiconductor substrate, a surface of which is rough due to the wiring pattern in the semiconductor substrate.

4. The semiconductor device according to claim 1, wherein the second metal wire has a width equal to a minimum width of the first metal wire.

5. The semiconductor device according to claim 1, wherein the second metal wire has a length longer than a maximum length of the first metal wire.

6. The semiconductor device according to claim 1, wherein the test electrode has a dimension and a pitch each equal to those of the first external electrodes or the second external electrodes.

7. The semiconductor device according to claim 1, wherein the test electrode has a dimension smaller than that of those of the first external electrodes or the second external electrodes.

8. A semiconductor wafer comprising:
   a semiconductor substrate having a plurality of semiconductor integrated circuit areas;
   an element electrode on each of the semiconductor integrated circuit areas of the semiconductor substrate and electrically connected to the semiconductor integrated circuit;
   at least one test electrode on the semiconductor substrate;
   a plurality of first external electrodes on each of the semiconductor integrated circuit areas of the semiconductor substrate, connected to the element electrode with a first metal wire;
   a plurality of second external electrodes on each of the semiconductor integrated circuit areas of the semiconductor substrate, connected to the element electrode by the first metal wire and connected with the test electrode by a second metal wire, and
   wherein the second metal wire is for detecting through an electrical test shape defects of a metal wire in the wafer.

9. The semiconductor wafer according to claim 8, wherein the second metal wire is on a portion of the semiconductor substrate, a surface of which is rough due to a wiring pattern in the semiconductor substrate.

10. The semiconductor wafer according to claim 8, wherein the second metal wire has a width equal to a minimum width of the first metal wire.

11. The semiconductor device according to claim 8, wherein the second metal wire has a length longer than a maximum length of the first metal wire.

12. The semiconductor device according to claim 1, wherein a second metal wire connects a test electrode with another test electrode.

13. The semiconductor device according to claim 1, wherein a second metal wire connects a second external electrode with another second external electrode.

14. The semiconductor wafer according to claim 8, wherein a second metal wire connects a test electrode with another test electrode.

15. The semiconductor wafer according to claim 8, wherein a second metal wire connects a second external electrode with another second external electrode.

16. The semiconductor device according to claim 1, wherein the test electrode and the second external electrode are connected to a same element electrode.

* * * * *